(12) United States Patent
Cannon et al.

(10) Patent No.: US 7,881,135 B2
(45) Date of Patent: Feb. 1, 2011

(54) METHOD FOR $Q_{CRIT}$ MEASUREMENT IN BULK CMOS USING A SWITCHED CAPACITOR CIRCUIT

(75) Inventors: Ethan H. Cannon, Essex Junction, VT (US); Alan J. Drake, Round Rock, TX (US); Fadi H. Gebara, Austin, TX (US); John P. Keane, Minneapolis, MN (US); AJ Kleinosowski, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1010 days.

(21) Appl. No.: 11/679,406

(22) Filed: Feb. 27, 2007

(65) Prior Publication Data

US 2010/0271057 A1    Oct. 28, 2010

(51) Int. Cl.
*G11C 29/00* (2006.01)
(52) U.S. Cl. .................... 365/201; 257/297; 324/763; 365/149; 714/733
(58) Field of Classification Search ................ 257/297; 324/763; 365/149, 201; 714/733
See application file for complete search history.

(56) References Cited

U.S. PATENT DOCUMENTS

| | | | |
|---|---|---|---|
| 4,323,842 A * | 4/1982 | McGarrity et al. ......... 324/765 |
| 5,396,169 A * | 3/1995 | Buehler et al. ........... 324/158.1 |
| 5,982,691 A | 11/1999 | Shabde et al. |
| 6,330,182 B1 | 12/2001 | Zhang |
| 6,492,830 B1 * | 12/2002 | Ju et al. ....................... 324/765 |
| 6,553,496 B1 * | 4/2003 | Buer ............................ 726/34 |
| 7,743,289 B2 * | 6/2010 | Furuta et al. ................ 714/704 |
| 2007/0096754 A1 * | 5/2007 | Johnson et al. ............. 324/750 |

* cited by examiner

*Primary Examiner*—Dang T Nguyen
*Assistant Examiner*—Alexander Sofocleous
(74) *Attorney, Agent, or Firm*—Libby Z. Handelsman; Jack V. Musgrove

(57) ABSTRACT

A test setup for estimating the critical charge of a circuit under test (CUT) uses a charge injection circuit having a switched capacitor that is selectively connected to a node of the CUT. A voltage measurement circuit measures the voltage at a tap in the charge injection circuit before and after the charge is injected. When the injected charge causes an upset in the logical state of the CUT, the critical charge is calculated as the product of the voltage difference and the known capacitance of the capacitor. In one embodiment, (NMOS drain strike simulation) the amount of charge injected is controlled by a variable pulse width generator gating the switch of the charge injection circuit. In another embodiment (PMOS drain strike simulation) the amount of charge injected is controlled by a variable voltage supply selectively connected to the charge storage node.

20 Claims, 5 Drawing Sheets

US 7,881,135 B2

METHOD FOR $Q_{CRIT}$ MEASUREMENT IN BULK CMOS USING A SWITCHED CAPACITOR CIRCUIT

STATEMENT REGARDING FEDERALLY SPONSORED RESEARCH OR DEVELOPMENT

This invention was made with Government support under DARPA, NBCH3039004. THE GOVERNMENT HAS CERTAIN RIGHTS IN THIS INVENTION.

BACKGROUND OF THE INVENTION

1. Field of the Invention

The present invention generally relates to testing of electrical circuits, particularly integrated circuits, and more specifically to a method and system for measuring the amount of electrical charge effectively arising at a circuit node (e.g., from a radiation strike) that is necessary to induce a change in the logical state of the circuit.

2. Description of the Related Art

Data processing systems such as general-purpose computers or special-purpose devices have many different storage elements including memory arrays for mass storage of program instructions and operand data, and registers which temporarily store values used by execution units during the functional operation of the device. A typical microprocessor contains many storage elements that represent the current state or operating mode of the machine at any given time. These storage elements are very critical for correct operation of the processor and any error in the data stored in these elements can easily lead to machine failure. Microprocessors also use latches to store ancillary information, including scan latches that are employed in level-sensitive scan design (LSSD) type systems. These systems generally allow information to be read from or written to the scan latches during operation of the data processing system in a separate clock domain.

Information stored in scan latches may include control, status or mode bits. For example, a data processing system might provide different mode configurations for clock control logic, and clock control latches can account for a significant portion of a microprocessor latch count. Microprocessors typically use control logic in local clock buffers to adjust the duty cycle and edge stressing of various clock pulses in the system and thereby meet the requirements of the local logic circuits. These clock buffer modes are set at system power-on using a scan controller, and often must maintain their logical value for days or months to ensure proper performance of the local logic circuits. However, these values can be upset during microprocessor operation due to a soft-error caused by stray cosmic radiation or alpha particles emitted from semiconductor packaging materials. The upset may be correctable by scanning in a new value, but systems may only allow scanning in a limited manner such as at power-on, meaning that the system must be restarted if a clock control latch becomes incorrectly set.

Soft errors have become a primary reliability concern in scaled technologies. These errors are often caused by alpha particle strikes emitted from packaging materials or by neutrons originating from cosmic radiation. The soft-error rate (SER) of a data processing system can exceed the combined failure rate of all hard-reliability mechanisms (gate oxide breakdown, electro-migration, etc.). Built-in soft-error protection has thus become a necessity for meeting robustness targets in advanced computer systems. All storage elements (random-access memory, latches, etc.) are highly susceptible to soft-error induced failures, but memory arrays are usually protected by error-correction codes (ECCs) while latches are usually not so protected. Soft errors in latches are accordingly the major contributors to overall system SER.

In one typical latch design data is stored in a cross-coupled inverter circuit. The state of this circuit is easily flipped by an alpha particle strike and in simple latches the data corruption occurs without detection. Once flipped, the state of the latch cannot be recovered. Combinational logic is typically more robust than sequential elements, i.e., static logic will eventually recover from an alpha strike, but a downstream error will arise if the temporary error induced in the logic arrives at a destination latch within the setup and hold time of that latch.

In order to devise better strategies for SER reduction, it is useful to understand the soft-error mechanism and in particular the smallest amount of charge that must be collected at a circuit node from a radiation strike in order to change the logical state of a latch. This critical charge, referred to as $Q_{CRIT}$, is a factor in determining the failure-in-time rate of the circuit. A higher $Q_{CRIT}$ often means a more robust circuit. Researchers currently utilize expensive and time-consuming particle beam experiments to find the critical charges for particular circuits of interest. This method requires the fabrication of very large circuit macros (e.g., tens of thousands of instance of each circuit structure to be analyzed) in order to gather statistics by radiating the entire test structure with the particle beam, but many approximations and assumptions must be made in the extraction of $Q_{CRIT}$ from such experiments. Furthermore, there are several difficulties with these experiments. They require a large and expensive particle accelerator, and must be planned and scheduled months in advance. Moreover, it is impossible to know the exact node of the circuit under test that was struck by a particle of the beam which leaves further guesswork in the analysis.

Another method for determining the robustness of a storage circuit in relation to induced soft errors is presented in U.S. Pat. No. 5,982,691. The $Q_{CRIT}$ measurement is based on an equivalent diode structure which is impinged by a light pulse. This approach is also fraught with difficulties such as estimating the energies of alpha-particle strikes, computing absorption coefficients for silicon, and determining the amount of current that flows through the diode. It also requires specialized off-chip testing equipment.

A third method for evaluating the robustness of a logic circuit is disclosed in U.S. Pat. No. 6,330,182 involving the use of a current source which produces a current wave at a node in a logic circuit meant to model that induced by particle strikes. The integration over time of the current wave with the smallest amplitude resulting in a flip of the output logic level of the circuit under test would be equal to $Q_{CRIT}$, but the patent makes no mention of any physical implementation of this method for hardware testing purposes, nor does it account for the fact that producing a current pulse representative of those created by high-energy particle strikes is practically impossible with on-chip equipment.

In light of the foregoing, it would be desirable to devise an improved method for estimating the $Q_{CRIT}$ of a logical circuit which does not require extensive off-chip instrumentation but still provides reliable results for further research into SER reduction and circuit design. It would be further advantageous if the method could more accurately pinpoint the particular node of the logical circuit which initiates an upset.

SUMMARY OF THE INVENTION

It is therefore one object of the present invention to provide an improved method for measuring the critical charge ($Q_{CRIT}$) necessary to upset the logical state of a circuit.

It is another object of the present invention to provide such a method which can be implemented without expensive or complicated off-chip equipment.

It is yet another object of the present invention to provide a method for $Q_{CRIT}$ measurement in bulk complementary metal oxide semiconducting (CMOS) devices which can be used to test specific nodes of a logical circuit.

The foregoing objects are achieved in a method of estimating the critical charge of a circuit under test (CUT) by setting a logical state of the CUT to an initial value, establishing an initial voltage at a charge storage node in a charge injection circuit, measuring the initial voltage, selectively injecting charge from the charge storage node into a node of the CUT, measuring a final voltage at the charge storage node after the charge has been injected, determining that the logical state of the CUT has changed after injecting the charge, and computing the amount of injected charge based on the initial and final voltages. In the preferred embodiment the charge injection circuit is a switched-capacitor circuit having a capacitor with a known capacitance, and the critical charge is computed as the product of the difference of the initial and final voltages with the capacitance. An exemplary test system for carrying out this method employs an integrated circuit which includes the CUT, the charge injection circuit, a voltage measurement circuit and means for controlling the charge injected. The critical charge calculation is carried out by an external workstation which is connected by an interface to pervasive logic in the integrated circuit chip for accessing the CUT and the various test components. The charge controlling means for one embodiment (NMOS drain strike simulation) includes a variable pulse width generator gating the switch of the charge injection circuit, while the charge controlling means for another embodiment (PMOS drain strike simulation) includes a variable voltage supply selectively connected to the charge storage node.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention provides a method for obtaining the critical charge ($Q_{CRIT}$) values of logical circuits, and in particular storage circuits, by injecting a charge at a node of the circuit and determining whether the logical state of the circuit subsequently changes (a simulated soft error). If such an error occurs, the amount of the charge is measured and recorded. In the preferred embodiment, charge is injected into the circuit node by selectively activating a switched-capacitor circuit. The switch (transistor) is selectively turned on to model a radiation event. The initial magnitude of the voltage stored on the capacitor at the switch's output is increased until a logical upset is observed at the circuit output. The estimated value for $Q_{CRIT}$ is calculated according to the equation $$Q_{CRIT} = C^*(V_{FINAL} - V_{INITIAL}),$$

where C is the capacitance of the charge injection capacitor, and $V_{FINAL}$ and $V_{INITIAL}$ are the final and initial voltage values at the charge storage node of that capacitor. In an actual upset event (e.g., alpha strike) a large amount of additional charge is created almost instantaneously, resulting in extreme voltage and current transients. For this experimental setup, the amount of the charge is limited to safely model the mechanism without damaging the circuit.

Figure 1:
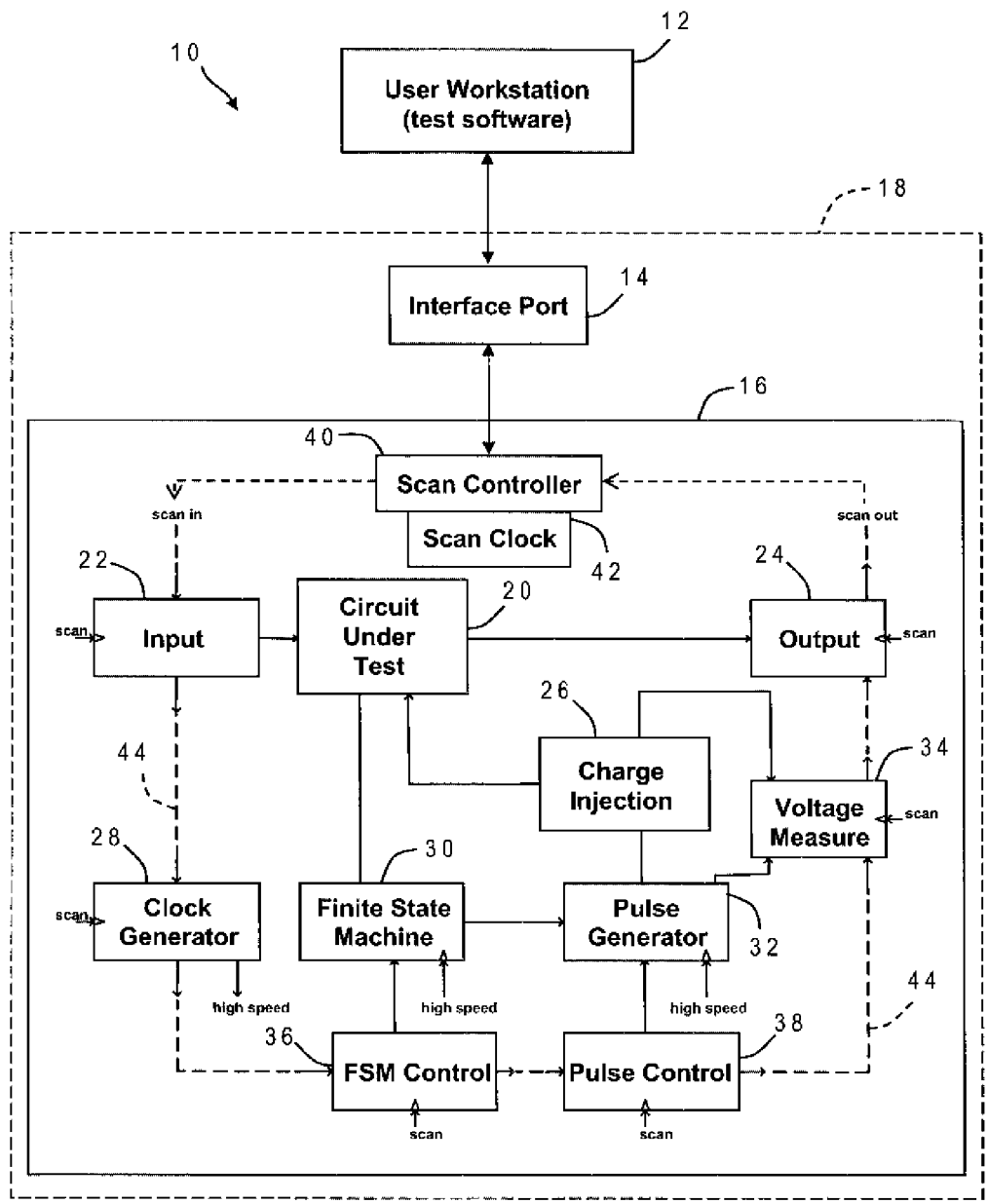
FIG. 1 is a block diagram of one embodiment of a test layout constructed in accordance with the present invention, depicting a workstation interface and scan ring for controlling a test procedure in an integrated circuit to measure a critical charge required to induce a change in the logical state of a circuit under test.

With reference now to the figures, and in particular with reference to FIG. 1, there is depicted one embodiment 10 of a test system constructed in accordance with the present invention. Test system 10 is generally comprised of a user workstation 12, an interface port 14, and an integrated circuit (IC) chip 16 which has the circuits to be tested along with adjunct testing circuitry. Interface port 14 and IC chip 16 are mounted on a printed circuit board 18 or other substrate. Interface port 14 may be a JTAG port which complies with the Institute of Electrical and Electronics Engineers (IEEE) standard 1149.1 pertaining to a test access port and boundary-scan architecture, or can simply be a probed or wirebonded pad on a testsite structure.

A single IC chip 16 preferably has a multitude of circuits to be tested. Some of these circuits and the manner in which they are tested may be the same for statistical purposes, but there can also be different types of logic circuits under test on the same chip or different manners of testing the same logic circuit, i.e., testing the $Q_{CRIT}$ for different nodes of the same circuit. For simplicity only one cell or circuit under test (CUT) 20 is shown in FIG. 1. The testing circuitry for CUT 20 includes an input latch 22 which sets the logical state of CUT 20, an output latch 24 which captures the output of CUT 20, a charge injection circuit 26, a clock generator 28, a finite state machine (FSM) 30, a variable pulse-width pulse generator 32, a voltage measurement circuit 34, FSM control logic 36, and pulse control logic 38. Clock generator 28 creates a high speed clock signal (around one GHz) for FSM 30 and pulse generator 32, and clock chopper can be used to obtain higher frequency pulses.

IC chip 16 also has pervasive logic which is used to load values into and read values from data latches, and to control various test components. This pervasive logic includes a scan controller 40 having a scan clock 42, and a scan ring 44 that runs through input latch 22, clock generator 28, FSM control logic 36, pulse control logic 38, voltage measurement circuit 34, and output latch 24. Scan controller 40 is connected to interface port 14 and so is further responsive to the test software running on workstation 12.

The user controls the test software to load test parameters into scan control 40 and thence to the scan satellites in scan ring 44, gated by scan clock 42. The test parameters may include the initial logical state for the CUT and control variables such as the initial pulse width and pulse width increment for pulse generator 32 and gating control for FSM 30. FSM 30 in turn controls the on-chip testing. Once the scan-in is complete, or after a start command is received via interface port 14, FSM 30 sets the initial state of CUT 20 and takes an initial voltage measurement. The timing of the voltage measurement readings is synchronized by pulse generator 32, which is in turn controlled by FSM 30. After the state of the cell is written from input latch 22, gating control over CUT 20 is disabled to leave the circuit floating as it would in normal use. A pulse is then sent to charge injection circuit 26 from pulse generator 32. The pulse width governs the quantity of charge that is injected into CUT 20. In this regard, those skilled in the art will appreciate that either a positive or negative charge can be injected depending on the nature of the particular CUT, although physically this polarity just refers to the direction of electron flow.

After the first pulse, i.e., after a predetermined amount of time from when the charge has been injected into CUT 20, FSM 30 checks the value in output latch 24 to determine if the logical state of CUT 20 has changed. If the state has not changed, then FSM 30 issues another signal to pulse generator 32 which adjusts the pulse width resulting in additional charge being injected into CUT 20. The charge injection circuit can be reset before sending a new pulse. The pulses continue until FSM 30 finally detects that the value in output latch 24 is an upset value. When this flip occurs, the final voltage measurement is taken by and no further pulses are sent. Voltage measurement circuit 34 is preferably a precision voltmeter accurate in the nanovolt range, that is shielded to reduce leakage and noise. An external (off-chip) voltmeter can be used, synchronized by FSM 30 through a pad or other interface on the chip. Since the voltage difference is used for computing the final capacitance rather than absolute voltage, voltage measurement circuit 34 does not require exact measurements but only needs to accurately detect changes in voltage.

This entire process can be repeated with multiple voltage measurement readings being stored in a single test procedure, or a single measurement can be taken and recorded with the system waiting until the test procedure is restarted. The voltage measurements are transmitted to workstation 12 using scan ring 44. FSM 30 may optionally be programmed to re-write the input data value from input latch 22 to CUT 20 between each pulse, so that testing can be applied to both a strong cell that was recently written, and a cell that may be weakened by leakage, etc. While this implementation illustrates the testing circuitry as part of IC chip 16, those skilled in the art will appreciate that most of the test components could be off-chip (except for the clock generator and pulse generator).

Figure 2A:
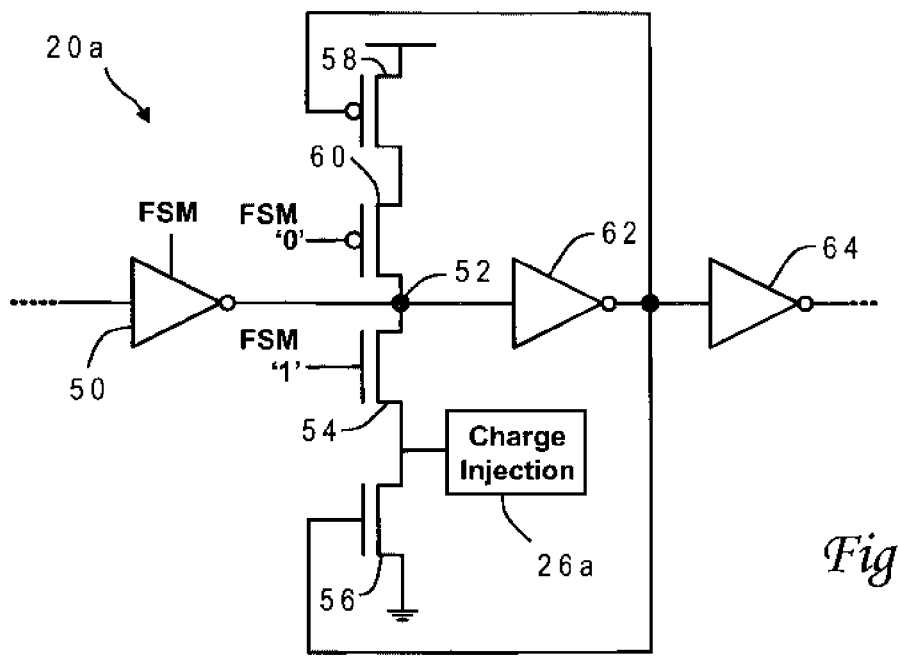
FIG. 2A is a schematic diagram illustrating a further embodiment of the invention wherein a latch circuit is the circuit under test and the charge is injected at a node of an n-type metal oxide semiconducting (NMOS) transistor.

A variety of circuits can be designed and fabricated for testing in this manner at any sensitive nodes of the circuits. FIG. 2A illustrates a further embodiment of the present invention wherein the circuit under test 20a is latch circuit that would be used in the second stage of a flip-flop latch. Latch circuit 20a has a tri-state input inverter 50 whose output is the data storage node 52 of the latch stage, two n-type metal oxide semiconducting (NMOS) transistors 54, 56 connected in series between data storage node 52 and electrical ground, two p-type metal oxide semiconducting (PMOS) transistors 58, 60 connected in series between data storage node 52 and the circuit power supply ($V_{dd}$), a feedback inverter 62 having an input connected to data storage node 52 and an output which controls the gates of NMOS transistor 56 and PMOS transistor 58, and an output inverter (inverting buffer) 64 whose input is connected to the output of feedback inverter 62. The input of tri-state inverter 50 receives the data value from input latch 22, and the output of output inverter 64 drives output latch 24. The gates of tri-state inverter 50, NMOS transistor 54 and PMOS transistor 60 are controlled by FSM 30.

Figure 2B:
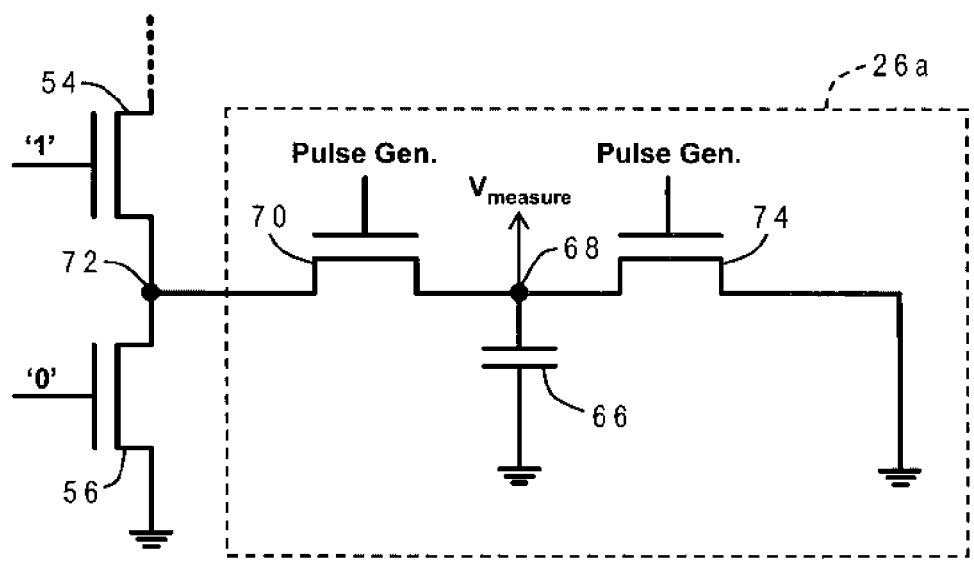
FIG. 2B is a schematic diagram illustrating one embodiment of a switched-capacitor circuit for injecting charge at the node of the NMOS transistor of FIG. 2A.

In this particular embodiment the charge injection circuit is applied at the junction between NMOS transistors 54 and 56 to simulate a drain strike at NMOS transistor 56. A suitable switched-capacitor charge injection circuit 26a for this application is shown in FIG. 2B. Charge injection circuit 26a has a capacitor 66 connected to ground and to a charge storage node 68, a first NMOS transistor 70 connecting the node 72 of the circuit under test to charge storage node 68, and a second NMOS transistor 74 connecting charge storage node 68 to electrical ground. The gates of NMOS transistors 70, 74 are controlled by pulse generator 32. Capacitor 66 should have a larger capacitance than the capacitance at node 72 to ensure proper discharge below the switching point of the circuit under test. The specific capacitance of capacitor 66 is defined by fabrication controls which select an appropriate size for capacitor 66 depending upon the particular device technology.

For this implementation the logical state of CUT 20a is initially set to logic "1" (high) so the voltage at data storage node 52 is around the power supply voltage ($V_{dd}$), and charge storage node 68 is initially set to zero by turning on NMOS transistor 74 (conducting) while NMOS transistor 70 is turned off (nonconducting). Thereafter one or more pulses from pulse generator 32 will briefly turn on NMOS transistor 70 and a charge is injected into test node 72 which is connected to the drain of NMOS transistor 56. Current is drawn through NMOS transistor 54 from data storage node 52. During the pulses NMOS transistor 74 remains off. Once sufficient charge has been injected the voltage level at data storage node 52 will drop below the threshold for a logical low state and the data value will flip to "0". This upset value is passed through inverters 62, 64, captured in output latch 24, and detected by FSM 30. A tap at charge storage node 68 allows voltage measurement circuit 34 to take initial (near zero for this case) and final readings. The critical charge for circuit 20a is then computed as the product of the voltage difference and the capacitance of capacitor 66. This calculation is performed by the test software running on workstation 12, which gets the voltage values through the pervasive logic in IC chip 16. A theoretical value for the capacitance can be used but empirical capacitance measurements for capacitor 66 are preferably obtained using a high-speed network analyzer (not during the test procedure). Charge injection circuit 26a can be used to test NMOS nodes in other storage circuits as well, such as static random-access memory (SRAM) cells.

Figure 2C:
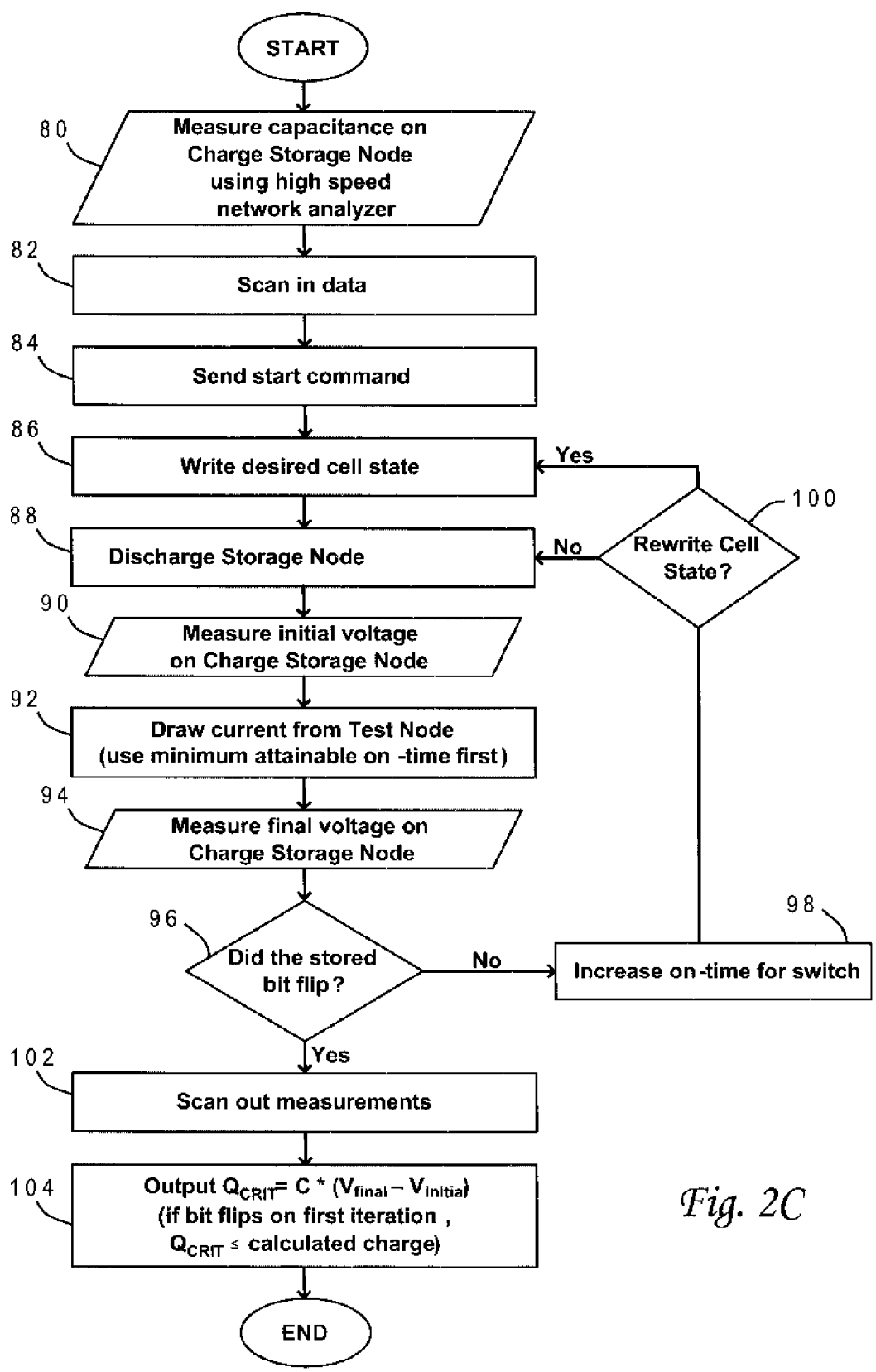
FIG. 2C is a chart illustrating the logical flow according to one implementation of the present invention for testing the latch circuit of FIG. 2A with the charge injection circuit of FIG. 2B.

FIG. 2C depicts the logical flow for the test implementation of FIGS. 2A and 2B (NMOS drain testing). The process begins by obtaining the capacitance value for capacitor 66 prior to actual testing of the circuit under test (80). The data and control values are then scanned into the test components using the scan ring (82), and a start command is sent via the JTAG or other interface (84). The desired state of the cell is written, for this implementation a "1" (86). Any charge at charge storage node 68 is zeroed out (88) and an initial voltage measurement is taken (90). Current is drawn from the node of the circuit under test using the minimum attainable "on" time for the pulsed transistor to simulate a radiation event (92) and another voltage measurement is taken (94). A determination is then made as to whether the stored data bit has been upset (96). If no upset has occurred, the "on" time for the pulsed transistor is increased (98), the data value is optionally rewritten to the cell (100), and the process repeats iteratively beginning at steps 86 or 88. If an upset does occur, the voltage measurements are scanned out (102), the critical charge is computed by the test software and output to the user (104), and the procedure ends. If the bit flips on the first iteration then the $Q_{CRIT}$ value represents an upper bound for the critical charge.

Figure 3A:
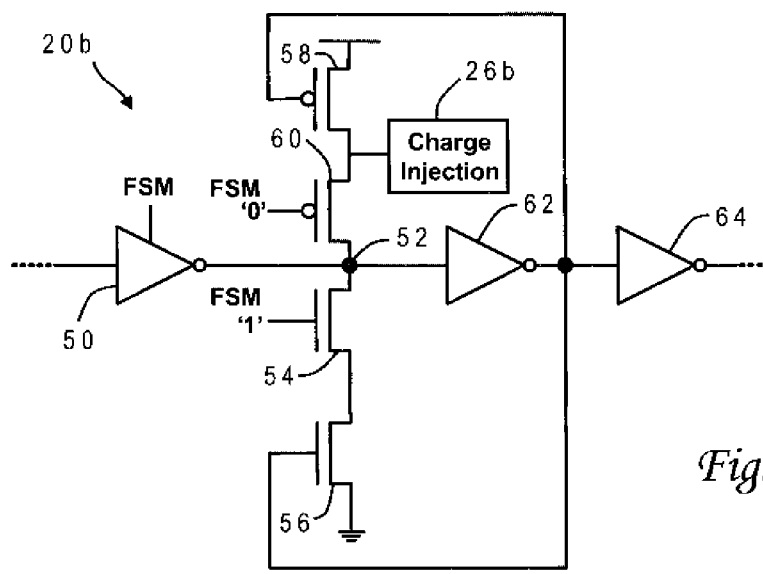
FIG. 3A is a schematic diagram illustrating a further embodiment of the invention wherein a latch circuit is the circuit under test and the charge is injected at a node of a p-type metal oxide semiconducting (PMOS) transistor.
Figure 3B:
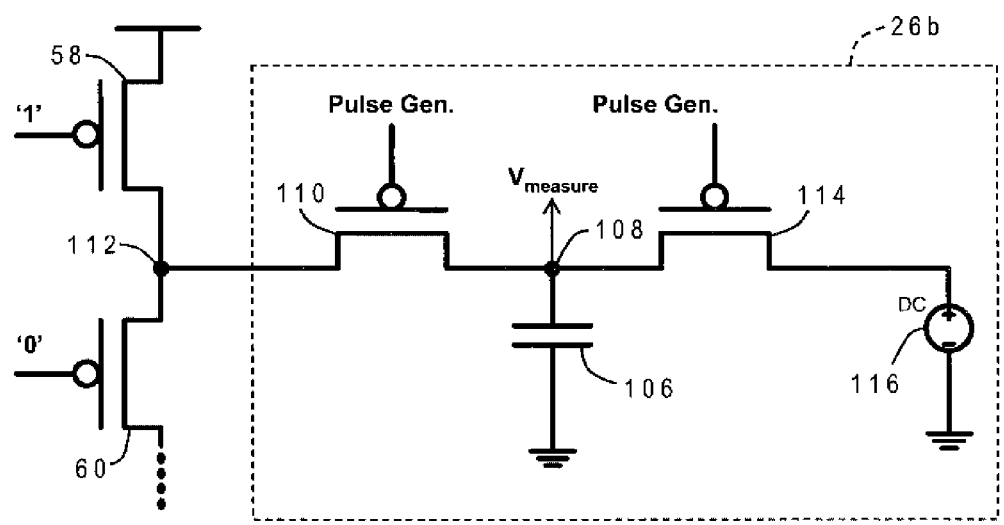
FIG. 3B is a schematic diagram illustrating another embodiment of a switched-capacitor circuit for injecting charge at the node of the PMOS transistor of FIG. 3A.

The preferred embodiments for radiation event modeling in PMOS and NMOS device drains are slightly different. After a strike near the drain of an "off" NMOS device electrons are swept to the drain region, creating a voltage transient and a possible upset of a logic "1" value stored at the output of the gate under test (a switch from "1" to "0"). For a PMOS drain, however, a strike can flip a stored data value of "0" to a "1". FIG. 3A illustrates the PMOS drain strike embodiment of the present invention. The circuit under test 20b is essentially identical to CUT 20a except that in the PMOS setup the charge injection circuit 26b is applied at the junction between PMOS transistors 58 and 60 to simulate a drain strike at PMOS transistor 58. Another switched-capacitor charge injection circuit 26b for this application is shown in FIG. 3B. Charge injection circuit 26b has a capacitor 106 connected to ground and to a charge storage node 108, a first PMOS transistor 110 connecting the node 112 of the circuit under test to charge storage node 108, and a second PMOS transistor 114 connecting charge storage node 108 to a voltage input from variable voltage supply 116. The gates of PMOS transistors 110, 114 are controlled by pulse generator 32, and variable voltage supply 116 is controlled by FSM 30.

For this implementation the logical state of CUT 20b is initially set to logic "0" (low) so the voltage at data storage node 52 is around zero, and charge storage node 108 is initially charged by turning off PMOS transistor 114 (conducting) while PMOS transistor 110 is turned on (nonconducting). Thereafter one or more pulses from pulse generator 32 will briefly turn off PMOS transistor 110 and a charge is injected into test node 112 which is connected to the drain of PMOS transistor 58. Current flows through PMOS transistor 60 to data storage node 52. During the pulses PMOS transistor 114 remains on (nonconducting). Once sufficient charge has been injected at test node 112, the voltage level at data storage node 52 will rise above the threshold for a logical high state and the data value will flip to "1". This upset value is passed through inverters 62, 64, captured in output latch 24, and detected by FSM 30. A tap at charge storage node 108 allows voltage measurement circuit 34 to take initial and final (near zero for this case) readings, and the critical charge for circuit 20b is again computed as the product of the voltage difference and the capacitance of capacitor 106. Charge injection circuit 26b can also be used to test PMOS nodes in other storage circuits such as SRAM cells.

Figure 3C:
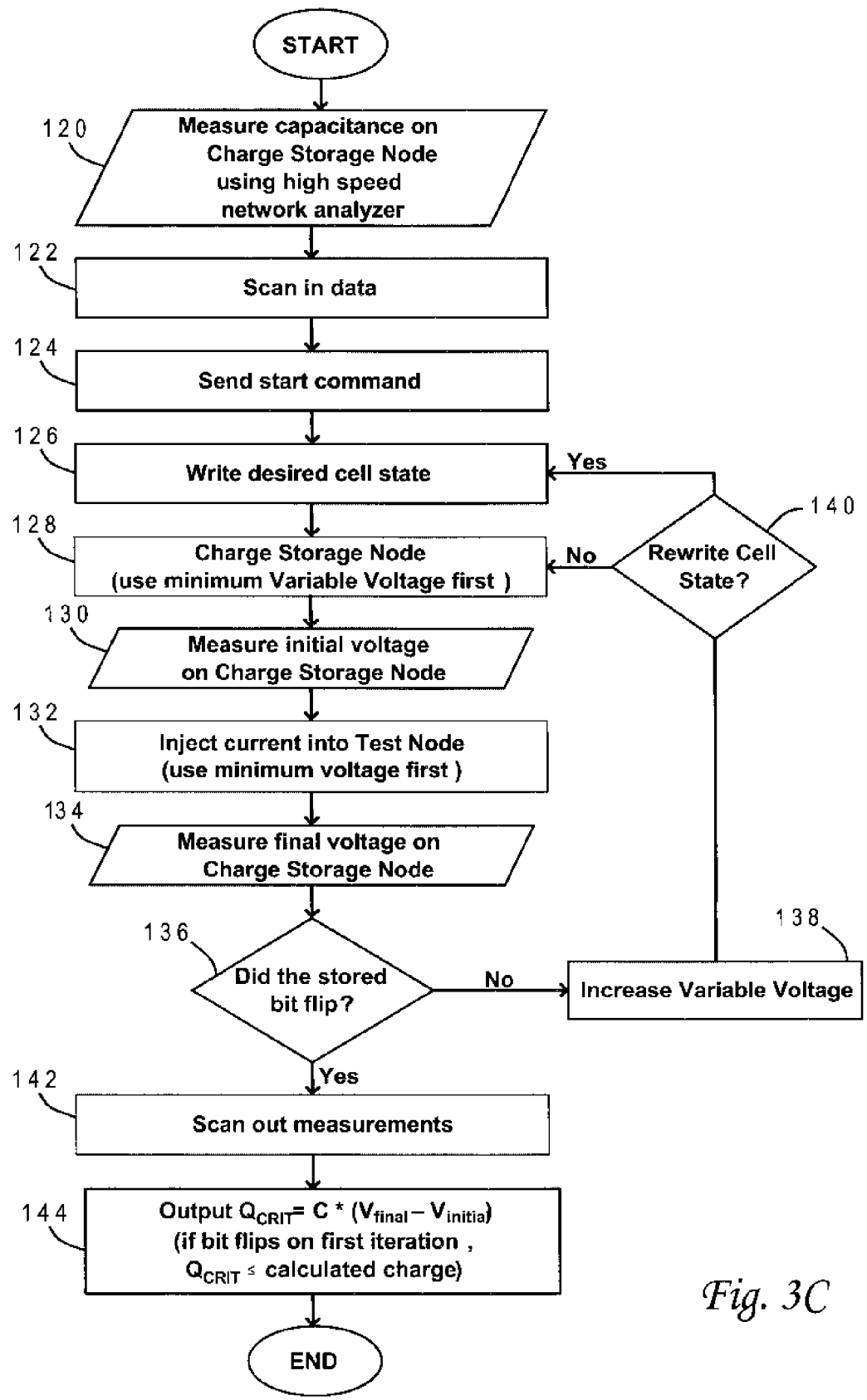
FIG. 3C is a chart illustrating the logical flow according to one implementation of the present invention for testing the latch circuit of FIG. 3A with the charge injection circuit of FIG. 3B.

FIG. 3C depicts the logical flow for the test implementation of FIGS. 3A and 3B (PMOS drain testing). The process begins by obtaining the capacitance value for capacitor 106 prior to actual testing of the circuit under test (120). The data and control values are then scanned into the test components using the scan ring (122), and a start command is sent via the JTAG or other interface (124). The desired state of the cell is written, for this implementation a "0" (126). Charge storage node 108 is charged using the minimum voltage attainable from variable voltage supply (128), and an initial voltage measurement is taken (130). Current is injected at the node of the circuit under test to simulate a radiation event (132) and another voltage measurement is taken (134). A determination is then made as to whether the stored data bit has been upset (136). If no upset has occurred, the voltage level of the variable voltage supply is increased (138), the data value is optionally rewritten to the cell (140), and the process repeats iteratively beginning at steps 126 or 128. If an upset does occur, the voltage measurements are scanned out (142), the critical charge is computed by the test software and output to the user (144), and the procedure ends.

The specific values for the switched capacitor, voltage supply and pulse widths may vary considerably depending upon the particular circuits being tested. For a circuit under test which uses sub-nanometer device technologies, an exemplary $V_{dd}$ is about one volt with a capacitance of about 50 femtofarads and pulse widths in the range of 20 to 100 picoseconds.

The test system of the present invention thus yields estimates of the critical charges for a variety of logic circuits under different conditions that are highly useful to the integrated circuit designer in developing accurate soft error rate models. The method provides valuable $Q_{CRIT}$ numbers without the need to fabricate large array macros, and does not require any specialized off-chip testing equipment. Circuits are tested on-chip in a manner that closely resembles their operation during use in functional components. The switched-capacitor charge injection circuit further avoids the problems associated with current sources such as a current mirror, so careful matching of devices, the creation of bias voltages, and mirroring currents off-chip are not necessary.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of testing a latch stage for a flip-flop latch, it is also applicable to other storage circuits such as SRAM or registers, and even dynamic circuits. It is therefore contemplated that such modifications can be made without departing from the spirit or scope of the present invention as defined in the appended claims.

What is claimed is:

1. A method of estimating a critical charge required to change a logical state of a circuit under test in an integrated circuit, comprising:

setting a logical state of the circuit under test to an initial value;

establishing a first voltage at a charge storage node in the integrated circuit;

measuring the first voltage;

selectively injecting a first charge from the charge storage node into a node of the circuit under test;
determining that the logical state of the circuit under test has not changed in response to said injecting of the first charge;
establishing a second voltage at the charge storage node;
measuring the second voltage;
selectively injecting a second charge from the charge storage node into the node of the circuit under test;
determining that the logical state of the circuit under test has changed in response to said injecting of the second charge;
measuring a third voltage at the charge storage node after said injecting of the second charge; and
computing an amount of the second charge based on the second and third voltages.

2. The method of claim 1 wherein:
the logical state of the circuit under test is set using a scan ring controlled by a user workstation;
the second and third voltages are transmitted to the user workstation by the scan ring; and
the user workstation carries out said computing.

3. The method of claim 1, further comprising rewriting the initial value to the circuit under test before said injecting of the second charge.

4. The method of claim 1 wherein:
the circuit under test is a storage circuit which includes a data storage node, a first NMOS transistor having a drain connected to the data storage node, and a second NMOS transistor having a drain connected to a source of the first NMOS transistor;
said setting sets the data storage node to a power supply voltage;
the charges are injected by sending a pulse to turn on a third NMOS transistor which connects a junction of the first and second NMOS transistors to a capacitor having a known capacitance; and
the amount of the second charge is computed by multiplying a difference of the second and third voltages with the capacitance of the capacitor.

5. The method of claim 4 wherein:
said injecting of the first charge sends a pulse having a first pulse width to turn on the third NMOS transistor; and
said injecting of the second charge sends a pulse having a second pulse width to turn on the third NMOS transistor, the second pulse width being longer than the first pulse width.

6. The method of claim 1 wherein:
the circuit under test is a storage circuit which includes a data storage node, a first PMOS transistor having a drain connected to the data storage node, and a second PMOS transistor having a drain connected to a source of the first PMOS transistor;
said setting sets the data storage node to zero voltage;
the charges are injected by sending a pulse to turn off a third PMOS transistor which connects a junction of the first and second PMOS transistors to a capacitor having a known capacitance; and
the amount of the second charge is computed by multiplying a difference of the second and third voltages with the capacitance of the capacitor.

7. The method of claim 6 wherein:
said establishing of the first voltage includes charging the charge storage node using a variable voltage supply at a first voltage level; and said establishing of the second voltage includes charging the charge storage node using the variable voltage supply at a second voltage level which is greater than the first voltage level.

8. A method of estimating a critical charge required to change a logical state of a circuit under test in an integrated circuit, comprising:
setting a logical state of the circuit under test to an initial value;
establishing an initial voltage at a charge storage node of a capacitor in the integrated circuit;
measuring the initial voltage;
injecting a first charge from the charge storage node into a node of the circuit under test;
determining that the logical state of the circuit under test has not changed in response to said injecting of the first charge;
rewriting the initial value to the circuit under test;
re-establishing the initial voltage at the charge storage node;
re-measuring the initial voltage;
injecting a second charge from the charge storage node into the node of the circuit under test after said rewriting, wherein the second charge is larger than the first charge;
determining that the logical state of the circuit under test has changed in response to said injecting of the second charge;
measuring a final voltage at the charge storage node after said injecting of the second charge; and
computing an amount of the second charge by multiplying a difference of the re-established initial voltage and the final voltage with a capacitance of the capacitor.

9. An integrated circuit comprising:
a circuit under test having a logical state which is set to an initial value;
a charge injection circuit which repeatedly injects charges from a charge storage node into a node of said circuit under test;
means for controlling an amount of charge injected from said charge injection circuit to increase the amount of injected charge until the logic state of the circuit under test has changed;
a tap at said charge storage node to allow voltage measurement of the charge storage node at an initial voltage before injection of the charge and at a final voltage after injection of the charge; and
means for computing a critical charge based on the initial voltage and the final voltage.

10. The integrated circuit of claim 9, further comprising a state machine which detects when the logical state of said circuit under test has changed.

11. The integrated circuit of claim 10, further comprising a voltage measurement circuit connected to said tap which outputs a voltage level of said charge storage node, said voltage measurement circuit being controlled by said state machine.

12. The integrated circuit of claim 11, further comprising a scan ring for accessing said circuit under test, said voltage measurement circuit, and said state machine.

13. The integrated circuit of claim 9 wherein:
said circuit under test is a storage circuit which includes
a data storage node,
a first NMOS transistor having a drain connected to said data storage node, and
a second NMOS transistor having a drain connected to a source of said first NMOS transistor;

the initial value for the logical state of said circuit under test corresponds to a power supply voltage at said data storage node; and said charge injection circuit includes
- a capacitor connected to electrical ground and a charge storage node,
- a third NMOS transistor connecting a junction of said first and second NMOS transistors to said charge storage node, and
- a fourth NMOS transistor connecting said charge storage node to electrical ground.

14. The integrated circuit of claim 13 wherein said controlling means includes a variable pulse-width pulse generator which controls the gates of said third and fourth NMOS transistors.

15. The integrated circuit of claim 9 wherein said circuit under test is a storage circuit which includes
- a data storage node,
- a first PMOS transistor having a drain connected to said data storage node, and
- a second PMOS transistor having a drain connected to a source of said first PMOS transistor;

the initial value for the logical state of said circuit under test corresponds to electrical ground; and said charge injection circuit includes
- a capacitor connected to electrical ground and a charge storage node,
- a third PMOS transistor connecting a junction of said first and second PMOS transistors to said charge storage node, and
- a fourth PMOS transistor connecting said charge storage node to a voltage input.

16. The integrated circuit of claim 15 wherein said controlling means includes a variable voltage supply connected to said voltage input.

17. A test system comprising:

a circuit under test;

a charge injection circuit having a charge storage node which is connected to a capacitor having a known capacitance and is selectively connected to a node of said circuit under test;

means for establishing an amount of a charge injected from said charge injection circuit;

means for determining when a logical state of the circuit under test has changed in response to the injected charge, said determining means further controlling said charge injection circuit and said establishing means to repeatedly inject charges of increasing amount until the logical state of the circuit under test has changed;

a voltage measurement circuit connected to said charge storage node which measures an initial voltage before injection of the charge and measures a final voltage after injection of the charge; and means for computing a critical charge for said circuit under test by multiplying a difference of the initial and final voltages with the known capacitance.

18. The test system of claim 17 wherein:

said computing means includes a workstation; and said circuit under test, said charge injection circuit, said establishing means, said determining means and said voltage measurement circuit are located in a single integrated circuit chip;

and further comprising:

pervasive logic in said integrated circuit chip for accessing said circuit under test, said charge injection circuit, said establishing means, said determining means and said voltage measurement circuit; and an interface port connecting said workstation to said pervasive logic.

19. The test system of claim 17 wherein:

said charge injection circuit includes at least one transistor connecting a junction of said circuit under test to said charge storage node; and said establishing means includes a variable pulse-width generator which gates said transistor.

20. The test system of claim 17 wherein said establishing means includes a variable voltage supply selectively connected to said charge storage node.

* * * * *